US012782402B2

(12) United States Patent
Pfab

(10) Patent No.: US 12,782,402 B2
(45) Date of Patent: Nov. 3, 2026

(54) METHOD AND DEVICE FOR DETERMINING CHARGING INFORMATION WITH REGARD TO A CHARGING OPERATION

(71) Applicant: Bayerische Motoren Werke Aktiengesellschaft, Munich (DE)

(72) Inventor: Xaver Pfab, Herdweg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 129 days.

(21) Appl. No.: 18/280,730

(22) PCT Filed: Mar. 8, 2022

(86) PCT No.: PCT/EP2022/055907

§ 371 (c)(1),
(2) Date: Sep. 7, 2023

(87) PCT Pub. No.: WO2022/189439

PCT Pub. Date: Sep. 15, 2022

(65) Prior Publication Data

US 2024/0302416 A1 Sep. 12, 2024

(30) Foreign Application Priority Data

Mar. 8, 2021 (DE) ..................... 10 2021 105 491.5

(51) Int. Cl.
*G01R 22/06* (2006.01)
*B60L 53/62* (2019.01)
(Continued)

(52) U.S. Cl.
CPC ............ *G01R 22/063* (2013.01); *B60L 53/62* (2019.02); *B60L 53/65* (2019.02); *B60L 53/665* (2019.02)

(58) Field of Classification Search
CPC ........ B60L 53/62; B60L 53/65; B60L 53/665; G01R 22/063
See application file for complete search history.

(56) References Cited

U.S. PATENT DOCUMENTS

2010/0161482 A1 6/2010 Littrell
2012/0140371 A1 6/2012 Gaul et al.
(Continued)

FOREIGN PATENT DOCUMENTS

CN 102334145 A 1/2012
CN 102576042 A 7/2012
(Continued)

OTHER PUBLICATIONS

International Search Report (PCT/ISA/210) issued in PCT Application No. PCT/EP2022/055907 dated Jul. 12, 2022 with English translation (6 pages).
(Continued)

*Primary Examiner* — Lee E Rodak
*Assistant Examiner* — Taqi R Nasir
(74) *Attorney, Agent, or Firm* — Crowell & Moring LLP

(57) ABSTRACT

A method for determining charging information with regard to a charging operation at a non-public location includes receiving metering data from an electricity meter for a charging point, the electricity meter being configured to capture metering data relating to a charging current provided at the charging point. The method also includes receiving, from a vehicle, charging operation data with regard to a charging operation of the vehicle at the charging point, the charging operation data including time information with regard to a beginning and an end of the charging operation. The method also includes determining, based on the metering data and the charging operation data, charging information about a total amount of power which has been provided
(Continued)

by the charging point to the vehicle during the charging operation.

9 Claims, 1 Drawing Sheet

(51) Int. Cl.
*B60L 53/65* (2019.01)
*B60L 53/66* (2019.01)

(56) References Cited

U.S. PATENT DOCUMENTS

| | | | | |
|---|---|---|---|---|
| 2012/0143423 A1* | 6/2012 | Theisen | G01R 22/06 701/22 |
| 2017/0043674 A1* | 2/2017 | DeBoer, III | B60L 53/63 |
| 2018/0188346 A1* | 7/2018 | Salem | G01R 22/061 |

FOREIGN PATENT DOCUMENTS

| | | |
|---|---|---|
| CN | 102803003 A | 11/2012 |
| CN | 107054146 A | 8/2017 |
| DE | 10 2009 030 090 A1 | 1/2011 |
| DE | 10 2009 034 887 A1 | 2/2011 |
| DE | 10 2009 043 306 A1 | 3/2011 |
| DE | 10 2011 107 628 A1 | 1/2013 |
| DE | 10 2014 104 845 A1 | 8/2015 |
| DE | 10 2017 105 014 A1 | 9/2018 |
| EP | 3 130 504 A1 | 2/2017 |
| JP | 2013-55861 A | 3/2013 |

OTHER PUBLICATIONS

German-language Written Opinion (PCT/ISA/237) issued in PCT Application No. PCT/EP2022/055907 dated Jul. 12, 2022 with English translation (14 pages).
German-language Search Report issued in German Application No. 10 2021 105 491.5 dated Mar. 8, 2022 with partial English translation (9 pages).
Chinese-language Office Action issued in Chinese Application No. 202280015755.1 dated Dec. 5, 2025, with English translation (17 pages).
Chinese-language Office Action issued in Chinese Application No. 202280015755.1 dated Jun. 29, 2026 with English translation (18 pages).

* cited by examiner

METHOD AND DEVICE FOR DETERMINING CHARGING INFORMATION WITH REGARD TO A CHARGING OPERATION

BACKGROUND AND SUMMARY OF THE INVENTION

The technology disclosed herein relates to a method and to a corresponding device which permit an efficient and reliable determination of charging information with regard to charging operations which are executed in the private households of vehicle owners.

Firms extensively permit fuel costs incurred for vehicles used by employees to be charged by employees to the firm. Evidence of the cost of fueling operations can be provided, e.g. by way of a business fuel card or in the form of fuel receipts.

A vehicle which is at least partially electrically powered, such as e.g. a plug-in hybrid vehicle or a battery electric vehicle (BEV), can be charged by a user in the private household of the user. Typically, it is not possible, or only possible with a relatively high degree of complexity, for the quantity of electrical energy employed in a charging operation of the vehicle to be determined in a calibration-compliant and/or accurate manner, in order to permit costs for this quantity of energy to be billed.

It is a preferred object of the technology disclosed herein to reduce or eliminate at least one disadvantage of a previously known solution, or to propose an alternative solution. In particular, a preferred object of the technology disclosed herein is to permit an efficient and reliable determination of the quantity of energy employed for a charging operation of a vehicle in a private household. Further preferred objects can proceed from the advantageous effects of the technology disclosed herein. The object(s) is/are fulfilled by the subject matter of the claimed invention.

According to one aspect, a method is described for determining charging information with regard to a charging operation in a non-public location, particularly in a household of a user of a vehicle which is to be charged. The vehicle can be at least partially electrically powered. In particular, the vehicle can be a plug-in hybrid vehicle or a battery electric vehicle (BEV).

The method comprises the reception of metering data from a (calibration-compliant) electricity meter of the non-public location for a charging point of the non-public location. The charging point can comprise a wallbox or a domestic plug socket. The electricity meter can be designed to capture metering data relating to the charging current which is delivered at the charging point. Optionally, metering data can thus indicate exactly such current and/or exclusively such current as is delivered at the charging point. In other words, the electricity meter can be restricted to the metering of current at the charging point. Metering data can be transmitted from the non-public location via a Wide Area Network (WAN).

The method further comprises the reception, from the vehicle, of charging operation data with regard to a charging operation of the vehicle at the charging point. Charging operation data can be transmitted from the vehicle (via the WAN). Charging operation data can comprise time information with regard to a start and finish of the charging operation. In particular, charging operation data can indicate the starting time point and the finishing time point of the charging operation.

The method further comprises the determination, on the basis of metering data and on the basis of charging operation data, of charging information with regard to the total quantity of energy which has been delivered by the charging point to the vehicle during the charging operation.

By the consideration of (calibration-compliant) metering data from an electricity meter in the non-public domain, and by the consideration of charging operation data from the vehicle which has executed a charging operation, the quantity of energy employed in a charging operation can be determined in a particularly efficient and accurate manner, and can optionally be settled by a third party, for example by the employer of the user of the vehicle.

Metering data can comprise a plurality of meter reading values from the electricity meter for a corresponding plurality of time points. For example, meter reading values can be periodically delivered in metering data with a specific temporal resolution (e.g. every 15 minutes or more frequently, or every five minutes or more frequently, or every minute or more frequently). A temporal sequence of meter reading values can thus be provided in metering data.

The method can comprise the determination, on the basis of metering data, of a starting meter reading value of the electricity meter at the starting time point of the charging operation, and of a finishing meter reading value of the electricity meter at the finishing time point of the charging operation. The starting meter reading value and/or the finishing meter reading value can optionally be determined by interpolation from the plurality, in particular from the temporal sequence of meter reading values from metering data.

Charging information with regard to the quantity of energy employed in the charging operation can then be determined in a particularly accurate manner on the basis of the starting meter reading value and the finishing meter reading value, particularly from the difference between the finishing meter reading value and the starting meter reading value.

In a particularly preferred example, the (calibration-compliant) electricity meter is a submeter of a smart meter gateway of the non-public location. The submeter can then transmit metering data via a local metrological network (LMN) of the non-public location to the smart meter gateway. Alternatively or additionally, the smart meter gateway can receive metering data via a local metrological network of the non-public location. Moreover, metering data received (from the device) can be data which have been transmitted from the smart meter gateway. By the employment of a smart meter gateway, calibration-compliant metering data can be provided in a particularly efficient manner.

Charging operation data can comprise an identifier of the vehicle, in particular a vehicle identification number. The method can comprise the determination, on the basis of the identifier of the vehicle, of charging information with regard to a mode of billing for the total costs of the quantity of energy which has been delivered to the vehicle from the charging point during the charging operation. In particular, on the basis of the identifier of the vehicle, it can be determined whether costs for this quantity of energy qualify for billing (to the employer of the user of the vehicle) or otherwise. By the consideration of the vehicle identifier, a particularly reliable billing of costs for an electric charging operation can be permitted.

Charging operation data can indicate a vehicle-side quantity of energy for the charging operation, which is determined by the vehicle. The vehicle-side quantity of energy can have been determined by a metering unit of the vehicle. Thus, by way of a metering unit of the vehicle, a quantity of energy can be detected which has been received in the context of the charging operation of the vehicle (for charging the energy store of the vehicle). The quantity of energy determined by the vehicle (alone) can be described as the vehicle-side quantity of energy for the charging operation.

In the context of the method, on the basis of metering data (captured by the electricity meter) and, in particular, on the basis of metering data alone, an electricity meter-side quantity of energy for the charging operation can be determined. The electricity meter-side quantity of energy for the charging operation, in particular, can be determined on the basis of metering data, and on the basis of time information (delivered by the vehicle) with respect to the start and finish of the charging operation. For example, the electricity meter-side quantity of energy can be determined on the basis of the starting meter reading value and on the basis of the finishing meter reading value, particularly from the difference between the finishing meter reading value and the starting meter reading value.

Charging information with regard to the (effective and/or actual) quantity of energy which has been delivered to the vehicle in total by the charging point during the charging process can then be determined with a particularly high degree of accuracy and/or reliability on the basis of the electricity meter-side quantity of energy and on the basis of the vehicle-side quantity of energy for the charging operation. For example, the total quantity of energy which has delivered to the vehicle by the charging point during the charging operation can be determined as an (optionally weighted) mean of the electricity meter-side quantity of energy and the vehicle-side quantity of energy for the charging operation. Alternatively or additionally, the vehicle-side quantity of energy can be employed for the verification and/or plausibility checking of the electricity meter-side quantity of energy. A particularly reliable billing of a charging operation at a non-public charging point can be permitted accordingly.

According to a further aspect, a software (SW) program is described. The SW program can be designed for running on a processor, in order to execute the method described in the present document.

According to a further aspect, a storage medium is described. The storage medium can comprise a SW program, which is designed for running on a processor, in order to execute the method described in the present document.

According to a further aspect, a device is described for determining charging information with regard to a charging operation at a non-public location. The device is designed to capture metering data from an electricity meter in the non-public location for a charging point of the non-public location. The electricity meter is thus configured to capture metering data relating to the charging current which is delivered at the charging point. The device is further designed to receive, from a (motor) vehicle (in particular from a passenger car, or a heavy goods vehicle, or a bus, or a motorcycle), charging operation data with regard to a charging operation of the vehicle at the charging point. Charging operation data can comprise time information with regard to a start and finish of the charging operation. The device is further designed, on the basis of metering data and on the basis of charging operation data, to determine charging information with regard to the total quantity of energy which has been delivered by the charging point to the vehicle during the charging operation.

It should be observed that the methods, devices and systems described in the present document can be employed in isolation, or in combination with other methods, devices and systems described in the present document. Moreover, any aspects of the methods, devices and systems described in the present document can be mutually combined in a variety of ways. In particular, the features of the claims can be mutually combined in a variety of ways.

The invention is described in greater detail hereinafter with reference to exemplary embodiments.

DETAILED DESCRIPTION OF THE DRAWINGS

Figure 1:
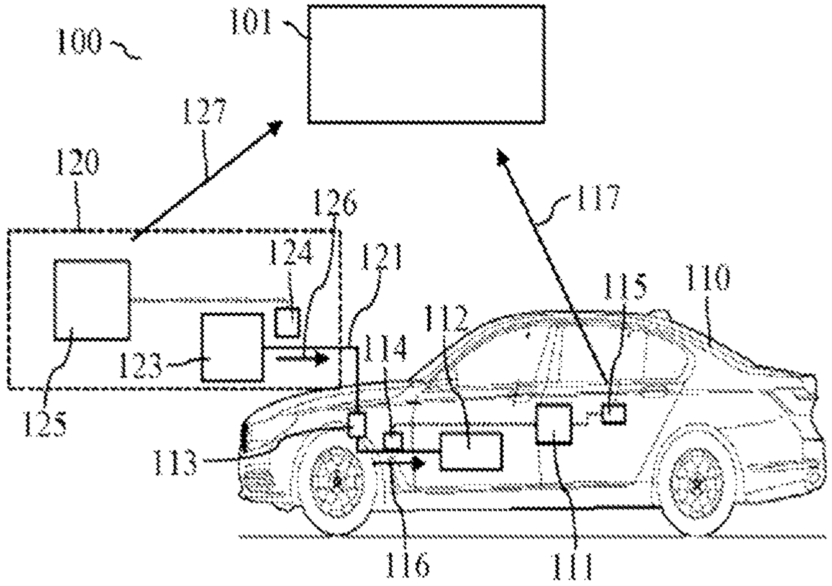
FIG. 1 shows an exemplary system for charging a vehicle in a household.

As indicated above, the present document addresses the provision of an efficient, reliable and calibration-compliant determination of the quantity of energy employed for a charging operation in a household (generally in a non-public domain). In this connection, FIG. 1 shows an exemplary system 100 for charging a vehicle 110. The system 100 comprises a charging point 123 which is arranged in a household 120, e.g. a wallbox or a mains plug socket, which can be connected, e.g. by way of a charging cable 121, to a charging interface 113 of the vehicle 100. From the charging point 123, a charging current 116, 126 can be transmitted to the charging interface 113 for charging an electrical energy store 112 of the vehicle 100.

In the household 120, a gateway unit 125, in particular a smart meter gateway, can be arranged, which is designed to communicate via an (optionally wireless) communication link with a central unit 101 (in general, with a device). The gateway unit 125 can be designed, by way of an electricity meter 124, e.g. by way of a (calibration-compliant) submeter of the gateway unit 125, to determine household metering data 127 with regard to the quantity of energy, particularly with regard to the charging current 126, which is or which has been delivered by the charging point 123 within a specific time interval. The gateway unit 125 can further be designed to transmit household metering data 127 to the central unit 101.

The vehicle 100 can comprise a control device 111 which is designed, e.g. by way of a vehicle metering unit 114, to determine charging operation data 117 with regard to a charging operation of the vehicle 100, and to execute the transmission thereof to the central unit 101 by way of a communication unit 115 of the vehicle 100. Charging operation data 117 can be transmitted to the central unit 101 further to the completion of a charging operation. Charging operation data 117 can indicate the following: an identifier of the vehicle 100, e.g. the vehicle identification number (VIN); a starting time stamp, which indicates the time point of the commencement of the charging operation; a finishing time stamp, which indicates the time point of the completion of the charging process; and/or the (vehicle-side) quantity of energy which has been received by the vehicle 100 during the charging process, particularly the quantity of charging current 116.

The central unit 101 can be designed, on the basis of charging operation data 117 delivered for the charging operation of the vehicle 100, and on the basis of household metering data 127 delivered by the gateway unit 125, to determine (calibration-compliant) charging information with regard to the quantity of energy which has been delivered in the household 120 for the charging operation of the vehicle 100. Charging information can then be employed, e.g. for the billing of costs for the charging operation.

In a household 120, in particular, a "smart meter gateway" 125 can be installed, which can be configured for the repeated transmission, particularly in a periodic manner, of metering data 127 from one or more electricity meters 124 of the household 120 to a central unit 101. The individual electricity meters 124 can be configured in a calibration-compliant manner.

In the household 120, in particular, a submeter 124 can be arranged, which is configured to record the charging current 126 which is delivered by a charging point 123. The meter reading of the submeter 124 can then be delivered via the gateway 125 to the central unit 101. The central unit 101 can be operated e.g. by the employer of the user of the vehicle 110 or by a service provider for the billing of charging operations. Charging current 126 for charging an electric vehicle 110 from a charging point 124 can thus be recorded, with no significant additional complexity, by reference to a dedicated submeter 124 of the household 120.

An unambiguous association between the billable vehicle 110 and the quantity of charging current recorded by the submeter 124 can be established by reference to a plausibility check between the energy flux measured in the submeter 124 and the charging operation in the billable vehicle 110. To this end, data from a message 117 can be employed, which is transmitted by the vehicle 110 to the central unit 101 during a charging operation or subsequently to a charging operation. The message 117 can indicate the VIN of the vehicle 110, the time stamp for the commencement of charging, the time stamp for the completion of charging and/or the quantity of charging current [e.g. measured in kWh] calculated in the vehicle 110.

By way of this information, a secure and unambiguous association of submetering data 127 from the household 120 with the message 117 from the qualifying vehicle 110 can be established. The charging point 123 can then be additionally employed for further, and optionally non-billable vehicles 110, as any illegitimate billing associated with the matching of data 117, 127 can be excluded.

Figure 2:
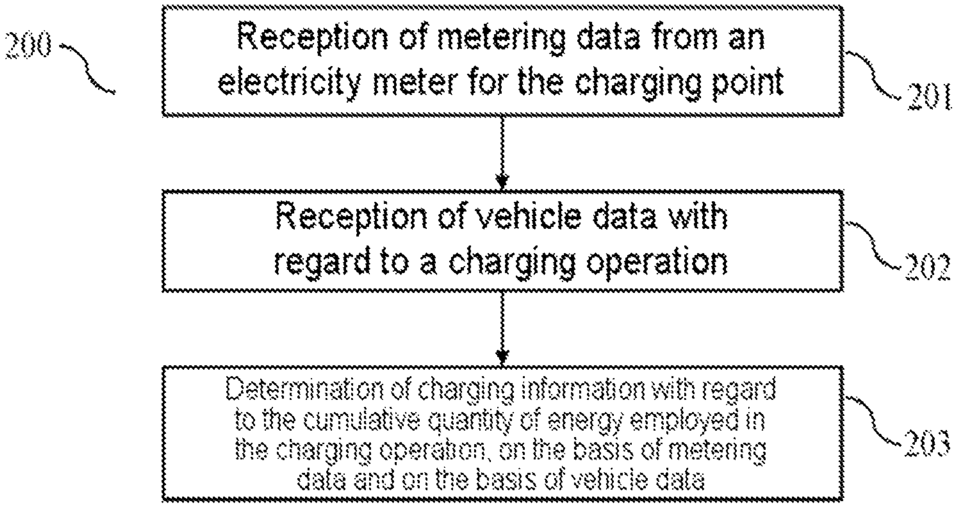
FIG. 2 shows a flow diagram of an exemplary method for determining charging information with regard to the quantity of energy employed in a charging operation.

FIG. 2 shows a flow diagram of an exemplary (and optionally computer-implemented) method 200 for determining charging information with regard to a charging operation in a non-public location 120, particularly in a household of a user of a vehicle 110. The method 200 can be executed by a central unit 101 or, in general, by a device.

The method 200 comprises the reception 201 of metering data 127 from an electricity meter 124 of the non-public location 120 for a charging point 123 of the non-public location 120. The (electronic) electricity meter 124 can be configured to capture metering data 127 with regard to charging current 126 which is delivered at the charging point 123. The electricity meter 124 can be configured to record exactly such charging current 126 as is delivered at the charging point 123. In particular, the electricity meter 124 can be reserved for the charging point 123. In other words, a dedicated electricity meter 124 can be employed for the charging point 123. Metering data 127 can have been transmitted via a Wide Area Network (WAN).

The method 200 further comprises the reception 202, from the vehicle 110 of the user, of charging operation data 117 with regard to a charging operation of the vehicle 110 at the charging point 123. Charging operation data 117 can have been transmitted from the vehicle 110 (e.g. via a wireless communication link and/or via a WAN). Charging operation data 117 can comprise time information with regard to a start and finish of the charging operation. In particular, the starting time point and the finishing time point of the charging operation can be indicated.

The method 200 further comprises the determination 203, on the basis of metering data 127 and on the basis of charging operation data 117, of charging information with regard to the total quantity of energy which has been delivered by the charging point 123 to the vehicle 110 during the charging operation. Metering data 127 can indicate e.g. the meter reading of the electricity meter 124 at a sequence of time points. On the basis thereof, a starting meter reading value of the electricity meter 124 at the starting time point of the charging operation and a finishing meter reading value of the electricity meter 124 at the finishing time point of the charging operation can be determined, e.g. by interpolation. From the difference in the meter readings, the quantity of energy employed for the charging operation of the vehicle 110 can then be determined in an accurate and efficient manner and, optionally, can be billed to the employer of the user of the vehicle 110.

The present invention is not limited to the exemplary embodiments represented. In particular, it should be observed that the description and the figures are only intended to illustrate the principle of the methods, devices and systems proposed, in an exemplary manner.

The invention claimed is:

1. A method for determining charging information with regard to a charging operation at a non-public location, the method comprising:

receiving metering data from an electricity meter of the non-public location for a charging point of the non-public location, wherein the electricity meter is configured to capture the metering data with regard to a charging current which is delivered at the charging point;

receiving, from a vehicle, charging operation data with regard to the charging operation of the vehicle at the charging point, wherein the charging operation data comprise time information with regard to a start and a finish of the charging operation, wherein the time information indicates a starting time point of the charging operation and a finishing time point of the charging operation, and wherein the charging operation data indicate a vehicle-side quantity of energy for the charging operation, which is determined by the vehicle;

determining, by a processor, based on the metering data and the time information with regard to the start and the finish of the charging operation, an electricity meter-side quantity of energy for the charging operation; and determining, by the processor, based on the electricity meter-side quantity of energy and the vehicle-side quantity of energy, charging information with regard to a total quantity of energy which has been delivered by the charging point to the vehicle during the charging operation, wherein determining the charging information comprises:

determining the charging information with regard to the total quantity of energy which has been delivered to the vehicle by the charging point during the charging operation based on a mean value of the electricity meter-side quantity of energy and the vehicle-side quantity of energy, and checking a plausibility of the electricity meter-side quantity of energy based on the vehicle-side quantity of energy.

2. The method according to claim 1, wherein:

the metering data comprise a plurality of meter reading values from the electricity meter for a corresponding plurality of time points;

the method further comprises:

determining, based on the metering data, a starting meter reading value of the electricity meter at the starting time point of the charging operation, and a finishing meter reading value of the electricity meter at the finishing time point of the charging operation; and determining the charging information with regard to the total quantity of energy based on the starting meter reading value and the finishing meter reading value.

3. The method according to claim 1, wherein:

the electricity meter is a submeter of a smart meter gateway of the non-public location; and the metering data received are data which have been transmitted by the smart meter gateway.

4. The method according to claim 3, wherein at least one of:

the submeter transmits the metering data via a local metrological network of the non-public location to the smart meter gateway; or the smart meter gateway receives the metering data via the local metrological network of the non-public location.

5. The method according to claim 1, wherein:

the charging operation data comprise an identifier of the vehicle; and the method further comprises determining, based on the identifier of vehicle, charging information with regard to a mode of billing for total costs of the total quantity of energy which has been delivered to the vehicle from the charging point during the charging operation.

6. The method according to claim 5, further comprising determining, based on the identifier of the vehicle, whether costs for the total quantity of energy qualify for billing.

7. The method according to claim 1, wherein the non-public location is a household of a user of the vehicle.

8. The method according to claim 1, wherein the charging point comprises a wallbox or a domestic plug socket.

9. A device for determining charging information with regard to a charging operation at a non-public location, the device comprising a processor, wherein the device is configured:

to capture metering data from an electricity meter in the non-public location for a charging point of the non-public location, wherein the electricity meter is configured to capture the metering data relating to a charging current which is delivered at the charging point;

to receive, from a vehicle, charging operation data with regard to a charging operation of the vehicle at the charging point, wherein the charging operation data comprise time information with regard to a start and a finish of the charging operation, wherein the time information indicates a starting time point of the charging operation and a finishing time point of the charging operation, and wherein the charging operation data indicate a vehicle-side quantity of energy for the charging operation, which is determined by the vehicle;

based on the metering data and the time information with regard to the start and finish of the charging operation, to determine an electricity meter-side quantity of energy for the charging operation; and based on the electricity meter-side quantity of energy and the vehicle-side quantity of energy, to determine charging information with regard to a total quantity of energy which has been delivered by the charging point to the vehicle during the charging operation, wherein determining the charging information comprises:

determining the charging information with regard to the total quantity of energy which has been delivered to the vehicle by the charging point during the charging operation based on a mean value of the electricity meter-side quantity of energy and the vehicle-side quantity of energy, and checking a plausibility of the electricity meter-side quantity of energy based on the vehicle-side quantity of energy.

* * * * *